(«12») United States Patent
Tanaka et al.

(10) Patent No.: US 8,194,469 B2
(45) Date of Patent: Jun. 5, 2012

(54) OPTICAL SENSOR ELEMENT, IMAGING DEVICE, ELECTRONIC EQUIPMENT AND MEMORY ELEMENT

(75) Inventors: Tsutomu Tanaka, Kanagawa (JP); Dharam Pal Gosain, Tokyo (JP)

(73) Assignee: Sony Corporation, Tokyo (JP)

( * ) Notice: Subject to any disclaimer, the term of this patent is extended or adjusted under 35 U.S.C. 154(b) by 630 days.

(21) Appl. No.: 12/361,049

(22) Filed: Jan. 28, 2009

(65) Prior Publication Data

US 2010/0097838 A1   Apr. 22, 2010

(30) Foreign Application Priority Data

Jan. 31, 2008   (JP) ................................. 2008-020558

(51) Int. Cl.
*G11C 16/04*   (2006.01)
(52) U.S. Cl. ........... 365/185.3; 365/185.14; 365/185.18; 365/185.24; 365/112
(58) Field of Classification Search ............... 365/185.3, 365/185.14, 185.18, 185.24, 112
See application file for complete search history.

(56) References Cited

U.S. PATENT DOCUMENTS

| 7,189,992 | B2 | 3/2007 | Wager et al. |
| 7,501,682 | B2* | 3/2009 | Choi et al. ..................... 257/321 |
| 7,710,787 | B2* | 5/2010 | Whiston et al. .......... 365/185.29 |
| 7,851,738 | B2* | 12/2010 | Sumi ......................... 250/208.1 |
| 7,883,934 | B2* | 2/2011 | Kaji et al. ..................... 438/104 |
| 2006/0108529 | A1 | 5/2006 | Saito et al. |

FOREIGN PATENT DOCUMENTS

| JP | 2003-101029 | 4/2003 |
| JP | 2006-502597 | 1/2006 |
| JP | 2006-121029 | 5/2006 |
| JP | 2006-165530 | 6/2006 |

OTHER PUBLICATIONS

Japanese Office Action for corresponding JP2008-020558 issued on Oct. 11, 2011.

* cited by examiner

*Primary Examiner* — Pho M Luu
(74) *Attorney, Agent, or Firm* — K&L Gates LLP

(57) ABSTRACT

An optical sensor element has a gate electrode opposed to a semiconductor layer made of an oxide semiconductor via a gate insulating film, source and drain electrodes being connected to the semiconductor layer, wherein the amount of light received by the semiconductor layer is read out as a drain current which changes in a non-volatile manner relative to a gate voltage.

12 Claims, 9 Drawing Sheets

FIG. 12A  FIG. 12B        FIG. 12F
FIG. 12D  FIG. 12C  FIG. 12E
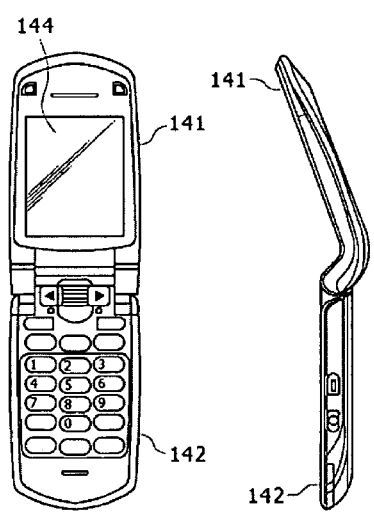
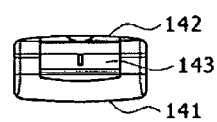
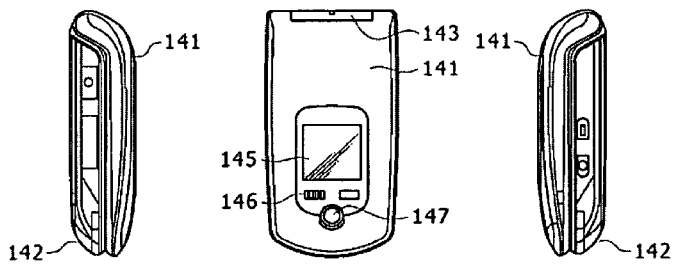
FIG. 12G

OPTICAL SENSOR ELEMENT, IMAGING DEVICE, ELECTRONIC EQUIPMENT AND MEMORY ELEMENT

CROSS REFERENCES TO RELATED APPLICATIONS

The present application claims priority to Japanese Patent Application JP 2008-020558 filed in the Japan Patent Office on Jan. 31, 2008, the entire contents of which being incorporated herein by reference.

BACKGROUND

The present application relates to an optical sensor element, and an imaging device and electronic equipment using the same, and further to a memory element and electronic equipment using the same. The present application relates more particularly to a configuration using a semiconductor layer made of an oxide semiconductor.

Recent years have seen increasingly multifunctional electronic equipment incorporating a flat display device such as liquid crystal or organic EL display device. Such multifunctionality includes screen input such as touch panel and pen input and backlight brightness control made possible by an optical sensor element provided on the display screen or in proximity thereto. Optical sensor elements and elements adapted to drive such electronic equipment which are provided in the electronic equipment use a semiconductor layer made of amorphous silicon or polycrystalline silicon crystallized by eximer laser or solid phase growth.

Further, a configuration using an oxide semiconductor has been proposed in recent years. Such an oxide semiconductor can be formed using an inexpensive sputter system for use as the semiconductor layer. For instance, JP-T-2006-502597 describes an example in which a thin film transistor is used as a drive element of the display device. This transistor uses a semiconductor layer made of an oxide semiconductor such as ZnO, $SnO_2$ or $In_2O_3$. As another example, Japanese Patent Laid-Open No. 2006-165530 discloses an X-ray sensor using an amorphous metal oxide semiconductor.

SUMMARY

Here, it has been discovered that a MOS element using a semiconductor layer made of the above oxide semiconductor offers heretofore unknown properties. In light of the above, it is desirable to provide optical sensor element and memory element driven by using the heretofore unknown properties of the MOS element using a semiconductor layer made of an oxide semiconductor as an active layer. Further, it is also desirable to provide an imaging device and electronic equipment using the same elements.

In order to achieve the above needs, an optical sensor element according to the present embodiment is a so-called MOS optical sensor element. The optical sensor element has a gate electrode opposed to a semiconductor layer made of an oxide semiconductor via a gate insulating film. Source and drain electrodes are connected to the semiconductor layer. The optical sensor element is particularly that the amount of light received by the semiconductor layer is read out as a drain current which changes in a non-volatile manner relative to a gate voltage.

It has been discovered, in a MOS element using a semiconductor layer made of an oxide semiconductor, that as the semiconductor layer receives light, the drain current (Id) relative to the gate voltage (Vg), i.e., the Vg-Id characteristic, changes in a non-volatile manner. Therefore, the amount of light received by the semiconductor layer can be detected by reading out the drain current (Id) after the light reception period of the semiconductor layer.

Here, such a non-volatile change of the Vg-Id characteristic takes place in the range of gate voltage lower than that at which an ON current is reached. The ON current is the maximum drain current (Id) in an initial state before the light irradiation. Therefore, the drain current is read out when the gate voltage is equal to or lower than the threshold voltage in the initial state and equal to or higher than the voltage during the light reception period of the semiconductor layer. This permits detection of the amount of light received by the semiconductor layer. On the other hand, before the drain current is read out, a reset operation is performed to restore the Vg-Id characteristic to its initial state before the light reception of the semiconductor layer.

Further, the present embodiment is an imaging device having the optical sensor element configured as described above. Further, the present embodiment is electronic equipment using an imaging device having the optical sensor element.

Further, the above non-volatile change of the Vg-Id characteristic resulting from the light irradiation can be taken advantage of in a memory element. That is, a memory element according to the present embodiment is a so-called MOS optical sensor element. The memory element has a gate electrode provided on a semiconductor layer, made of an oxide semiconductor, via a gate insulating film. Source and drain electrodes are connected to the semiconductor layer. The memory element is particularly that the amount of light received by the semiconductor layer is read out as a drain current which changes in a non-volatile manner relative to a gate voltage.

The present embodiment is also electronic equipment having the memory element configured as described above.

As described above, the present embodiment permits detection, in a so-called MOS element using a semiconductor layer made of an oxide semiconductor, of the amount of light received by the semiconductor layer using the newly discovered non-volatile change of the Vg-Id characteristic resulting from the light reception of the semiconductor layer. Further, the present embodiment permits this non-volatile change to be used as a memory function.

Additional features and advantages are described herein, and will be apparent from the following Detailed Description and the figures.

BRIEF DESCRIPTION OF THE FIGURES

FIG. 9A is a perspective view as seen from the front, and FIG. 9B is a perspective view as seen from the rear;

FIGS. 12A to 12G are views illustrating a personal digital assistant such as mobile phone to which the present embodiment is applied, and FIG. 12A is a front view of the mobile phone in an open position, FIG. 12B is a side view thereof, FIG. 12C is a front view thereof in a closed position, FIG. 12D is a left side view thereof, FIG. 12E is a right side view thereof, FIG. 12F is a top view thereof, and FIG. 12G is a bottom view thereof.

DETAILED DESCRIPTION

The present application will be described in detail below with reference to the accompanying drawings according to an embodiment.

<Optical Sensor Element and Memory Element>

Figure 1:
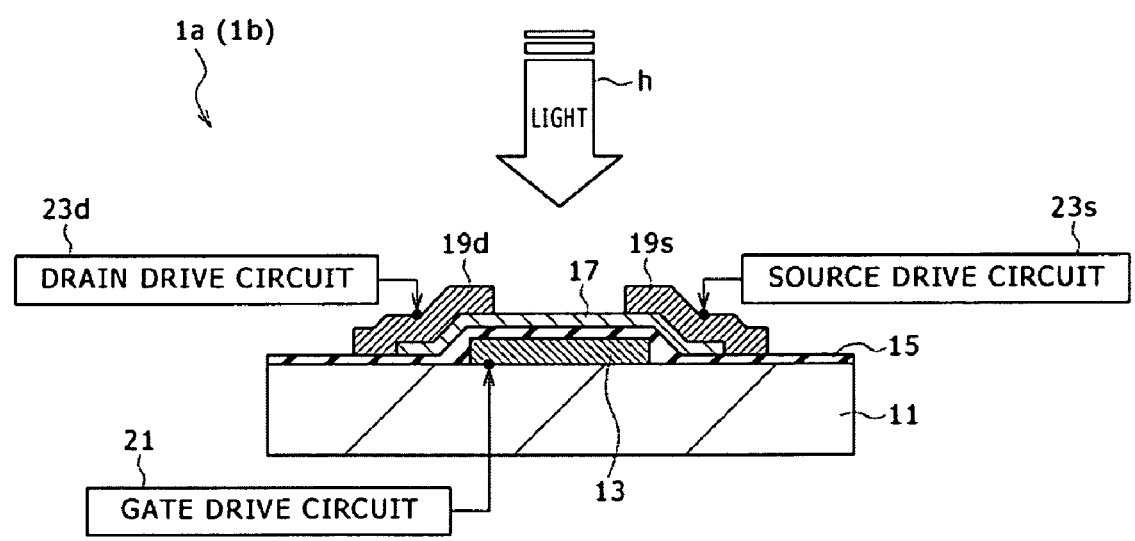
FIG. 1 is a schematic sectional view illustrating the configuration of an optical sensor element and memory element according to an embodiment.

FIG. 1 is a schematic sectional view illustrating the configuration of an optical sensor element to which the present embodiment is applied. An optical sensor element 1a shown in FIG. 1 is the so-called MOS optical sensor element 1a. The same element 1a is configured as described below.

That is, on a substrate 11 is disposed a gate electrode 13 which is made of a material such as molybdenum, titanium, tantalum or tungsten, or of an optically reflective material such as aluminum. The gate electrode 13 is driven by a gate drive circuit 21 in a manner described below. On the substrate 11 is provided a gate insulating film 15 in such a manner as to cover the gate electrode 13. The gate insulating film 15 should preferably be optically transmissive. On the gate insulating film 15 is formed a pattern of a semiconductor layer 17 in such a manner as to straddle the gate electrode 13. The semiconductor layer 17 is made of an oxide semiconductor. Among metal oxides used for this oxide semiconductor are InGaZnO, $SnO_2$, $In_2O_3$, ITO ($SnO_2+In_2O_3$), ZnO, CdO, $Cd_2SnO_4$, $TiO_2$ and $Ti_3N_4$.

Further, patterns of source and drain electrodes 19s and 19d are formed on the gate insulating film 15 on which the semiconductor layer 17 is provided. The patterns of the source and drain electrodes 19s and 19d are formed on both sides of the gate electrode 13 to sandwich the same electrode 13. The patterns of the source and drain electrodes 19s and 19d are formed so that the edge portion of each lies on one of the edge portion of the semiconductor layer 17. The source and drain electrodes 19s are each made of a conductive material and driven by a source drive circuit 23s or drain drive circuit 23d as described below.

Figure 2:
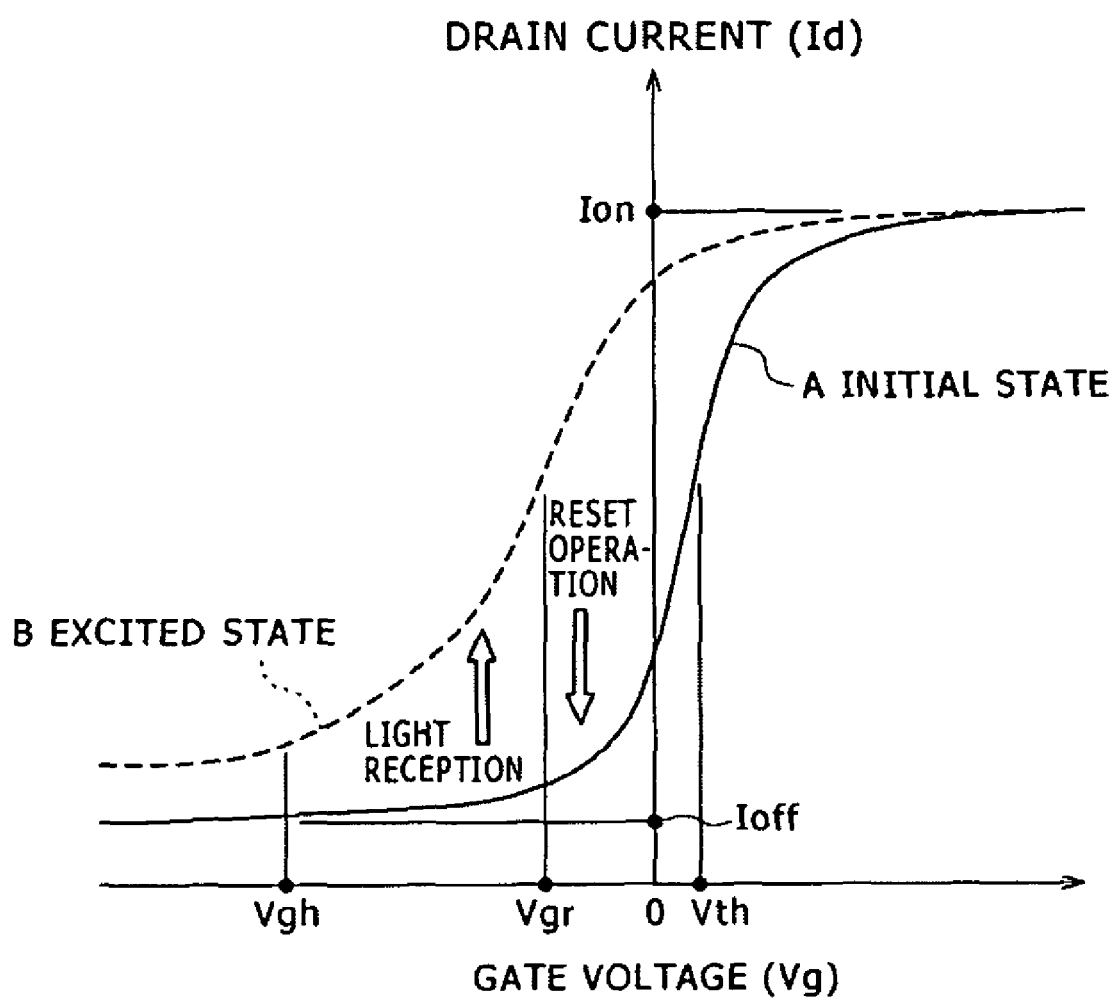
FIG. 2 is a diagram illustrating the Vg-Id characteristic of the optical sensor element and memory element according to the embodiment.

FIG. 2 is a diagram illustrating the relationship between the gate voltage (Vg) and drain current (Id), i.e., the Vg-Id characteristic, to describe the driving of the optical sensor element 1a having a layered configuration as described above. The optical sensor element 1a is driven by the gate drive circuit, source drive circuit and drain drive circuit.

When light is received from the semiconductor layer 17 made of an oxide semiconductor, the Vg-Id characteristic of the optical sensor element 1a changes in such a manner that the drain current (Id) increases from an initial state A before the light reception (hereinafter written as an excited state B). This change is non-volatile and will be retained even if the light reception is terminated. Therefore, the amount of light received by the semiconductor layer 17 is detected by reading out the drain current (Id) after the light reception. It should be noted that the light whose amount received by the semiconductor layer 17 can be detected is light having a wavelength which can be absorbed by the same layer 17. For this reason, if, for example, the semiconductor layer 17 is made of InGaZnO, the same layer 17 particularly significantly absorbs ultraviolet light at a wavelength of 420 nm or less. As a result, the amount of such light received will be detected.

On the other hand, such a non-volatile change of the Vg-Id characteristic takes place in the range of gate voltage lower than that at which the ON current (Id=Ion) is reached. The ON current is the maximum drain current (Id) in the initial state A before the light irradiation. Further, the Vg-Id characteristic changes in a non-volatile manner so that the drain current (Id) increases with increase in the amount of light received by the semiconductor layer 17.

Therefore, we assume that the gate voltage (Vgr) at the time of the readout of the drain current (Id) satisfies the relationship Vgh<Vgr<Vth where Vth is the threshold voltage in the initial state A, and Vgh the gate voltage during the light reception period of the semiconductor layer 17. This makes it possible to detect the amount of light received by the semiconductor layer 17 with high sensitivity. It should be noted that the threshold voltage (Vth) in the initial state A is the gate voltage (Vg) at which the change of the drain current is maximum. On the other hand, the voltage (Vgh) during the light reception period of the semiconductor layer 17 in the initial state A may be set, for example, to an OFF current (Id=Toff) range in which the drain current (Id) is minimum.

Further, because the Vg-Id characteristic changes in a non-volatile manner with change in the amount of light received by the semiconductor layer 17 as described above, the cumulative amount of light received by the same layer 17 is detected as the cumulative change of the Vg-Id characteristic relative to the initial state A by continuing or intermittently repeating the light reception period.

Figure 3:
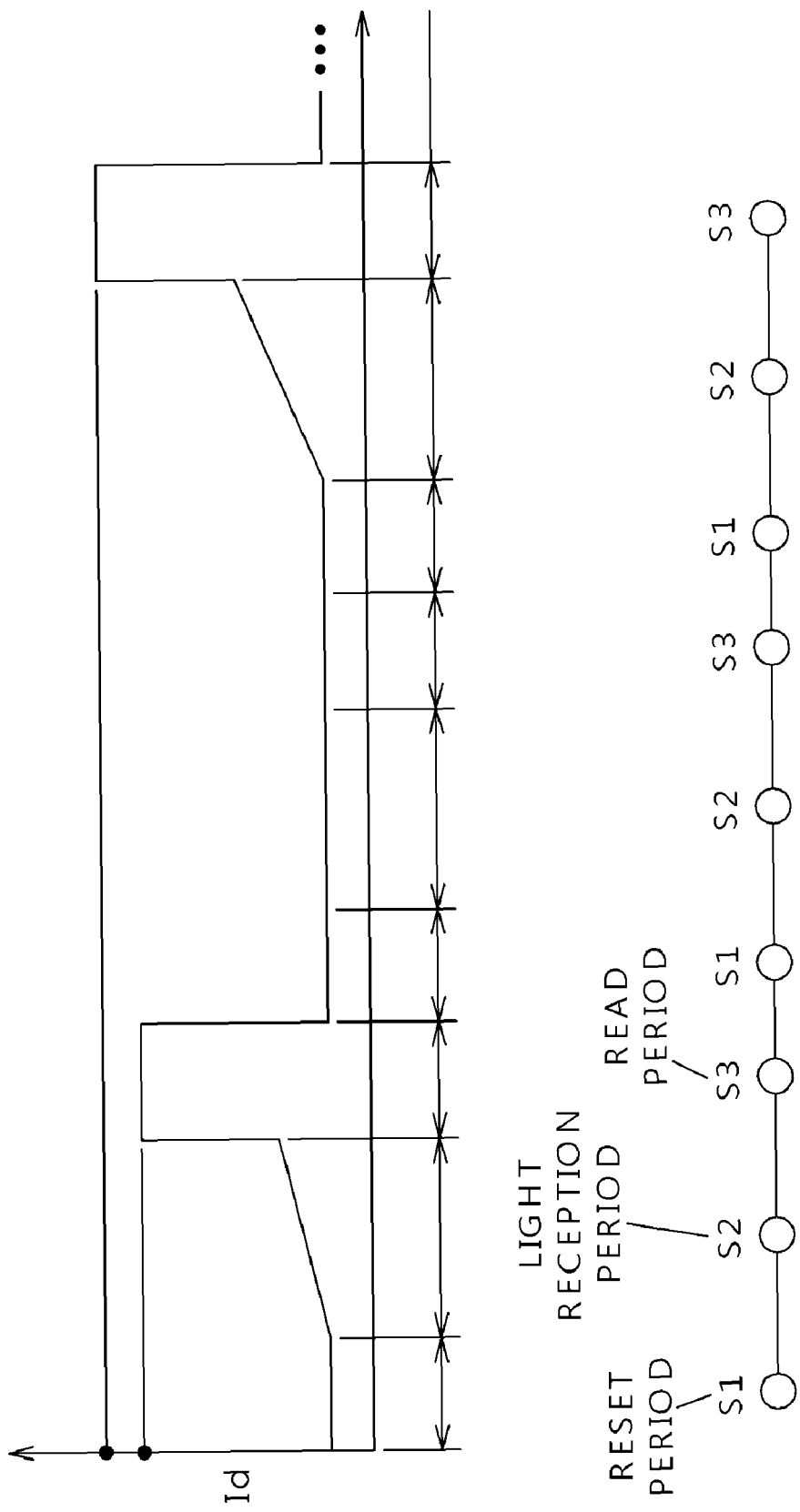
FIG. 3 is a diagram illustrating the drive sequence of the optical sensor element and memory element according to the embodiment.

On the other hand, FIG. 3 is a diagram illustrating the drive sequence of the optical sensor element 1a handled by the gate drive circuit, source drive circuit and drain drive circuit of the same element 1a having a layered configuration as described above. The sequence shown in FIG. 3 is intended to repetitively detect the amount of light received by the semiconductor layer 17 during a predetermined light reception period using the optical sensor element 1a driven as described above. The sequence will be described below with reference to FIGS. 1 and 2 as well as FIG. 3.

First, a reset operation is performed to restore the Vg-Id characteristic to the initial state A during the reset period in step S1. The following three steps (1) to (3) are performed in the reset operation. (1) Apply a positive voltage equal to the threshold voltage (Vth) or higher to the gate electrode 13 with the source and drain electrodes 19s and 19d shorted together. (2) Perform heat treatment. (3) Pass a current of predetermined magnitude or more between the source and drain electrodes for self-heating as heat treatment.

The reset operation consisting of the above three steps (1) to (3) is performed under proper conditions according to factors such as composition, film quality and film forming condition of the semiconductor layer 17 and the gate insulating film 15. For example, in the case of the gate insulating film 15 formed densely to be 100 nm thick at a film forming temperature of 400° C. on the gate electrode 13 made of InGaZnO, the gate voltage Vg of 15V was demanded to perform step (1) of the reset operation. Further, it has been found that if this gate insulating film 15 is formed, not as densely as the above, but to offer a film quality sufficiently adequate for use as a transistor insulating film, at a film forming temperature of 180° C., the gate voltage (Vg) need be 10V or less to perform step (1) of the reset operation. It has been also found that the reset operation can be performed even when the gate voltage (Vg) and drain voltage (Vd) are both 0V depending on conditions.

Next during the light reception period in step S2, light is received by the semiconductor layer 17. At this time, the light reception voltage (Vgh) is applied to the gate electrode 13 during the preset predetermined light reception period.

During the succeeding readout period in step S3, the drain current (Id) is read out with the read voltage (Vgr) applied to the gate electrode 13.

From here onwards, the amount of light received by the semiconductor layer 17 over time is detected by repeating steps S1 to S3.

The optical sensor element 1a configured as described above retains the amount of light received by the semiconductor layer 17 in a non-volatile manner relative to the Vg-Id characteristic. The same element 1a makes up an optical memory. That is, the optical sensor element 1a is also used as an optically written non-volatile memory element 1b.

The optical sensor element 1a (memory element 1b) configured as described above permits detection, in a so-called MOS element using the semiconductor layer 17 made of an oxide semiconductor, of the amount of light received by the semiconductor layer 17 with high sensitivity using the newly discovered non-volatile change of the Vg-Id characteristic resulting from the light reception of the semiconductor layer 17.

It should be noted that, in the above description, a so-called bottom-gate MOS element has been given as an example as the MOS optical sensor element 1a (memory element 1b). However, the optical sensor element 1a (memory element 1b) may be a so-called top-gate element having the gate electrode 13 provided above the semiconductor layer 17 via the gate insulating film 15. Further, two gate electrodes may be provided, one above and another below the gate insulating film, via the semiconductor layer 17. In this case, the driving of the two electrodes provides stability or reliability in switching operation. If two gate electrodes are formed one above and another below the semiconductor layer 17, some type of section must be provided to permit light to fall on the semiconductor layer. Leak light from the horizontal direction may be used. Alternatively, either or both of the upper and lower electrodes may be formed with a light-transparent material.

<Imaging Device and Memory Device>

Figure 4:
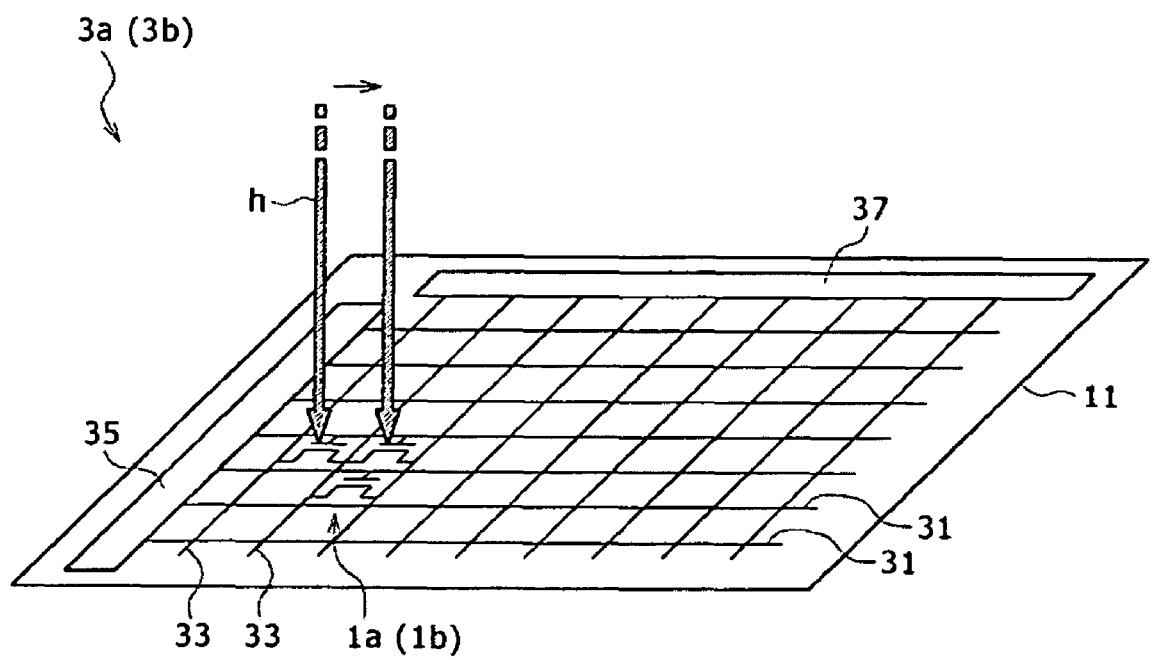
FIG. 4 is a diagram illustrating the configuration of an imaging device and memory device according to the embodiment.

FIG. 4 is a diagram illustrating the configuration of an imaging device 3a incorporating the optical sensor element 1a having the above-described MOS structure. As illustrated in FIG. 4, the imaging device 3a has the plurality of optical sensor elements 1a arranged in the imaging area of the substrate 11. On the substrate 11 are provided a plurality of select control lines 31 disposed in the horizontal direction and a plurality of signal lines 32 disposed in the vertical direction. Each of the sensor elements 1a is provided at the intersection between one of the select control lines 31 and one of the signal lines 33, with its gate electrode connected to one of the select control lines 31 and its source and drain electrodes connected respectively to the signal lines 33 on both sides.

A scan line drive circuit 35 and signal line drive circuit 37 are disposed around the imaging area in which the optical sensor elements 1a are arranged. The select control lines 31 are connected to the scan line drive circuit 35. The signal lines 33 are connected to the signal line drive circuit 37.

Of the two circuits, the scan line drive circuit 35 sequentially selects the select control lines 31 to drive the gate electrode of the optical sensor element 1a connected to the selected select control line 31 according to the sequence described in relation to the configuration of the optical sensor element 1a.

On the other hand, the signal line drive circuit 37 sequentially selects the signal lines 33 to drive the source and drain electrodes of the optical sensor element 1a connected to the selected signal lines 33 according to the sequence described in relation to the configuration of the optical sensor element 1a. It should be noted that, although the illustration is omitted here, a circuit may be connected to each of the signal lines 33. This circuit processes the electric signal which is sequentially extracted as the drain current to represent the amount of light received by the semiconductor layer of each of the optical sensor elements 1a.

The imaging device 3a configured as described above permits imaging using the optical sensor element 1a whose Vg-Id characteristic changes in a non-volatile manner as a result of the light reception of the semiconductor layer. It should be noted, however, that the light whose amount received by the semiconductor layer can be detected is light having a wavelength which can be absorbed by the semiconductor layer. For this reason, if, for example, the semiconductor layer is made of InGaZnO, imaging is conducted by detecting the amount of ultraviolet light received at a wavelength of 420 nm or less.

Further, the imaging device 3a described above is also used as a non-volatile multi-bit memory device 3b because the optical sensor element 1a serves as the memory element 1b in an 'as-is' manner. It should be noted that if the imaging device 3a is used as the memory device 3b, the semiconductor layer of each of the memory elements 1b (sensor element 1a) may receive light as the light to be irradiated is scanned onto the optical sensor elements 1a. However, it is essential to use, as the light to be irradiated onto the optical sensor elements 1a, the light at a wavelength which can be absorbed by the semiconductor layer.

<Electronic Equipment 1>

Figure 5:
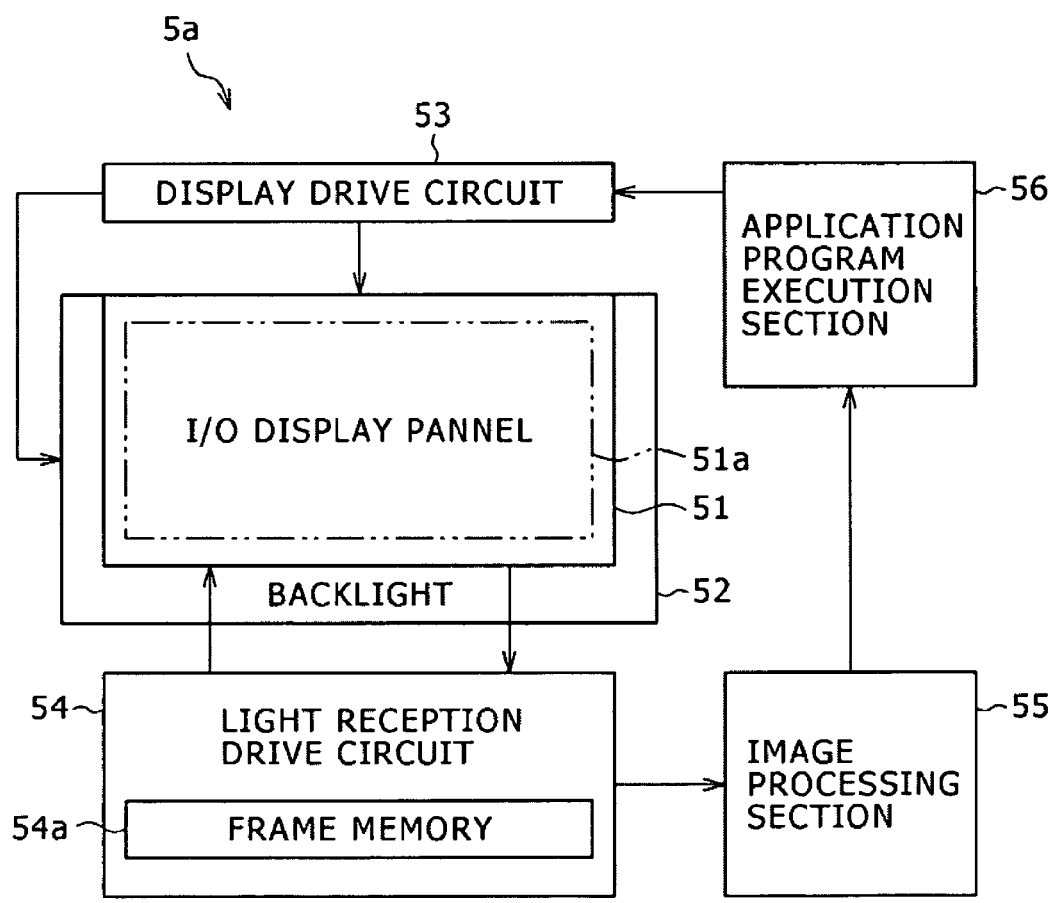
FIG. 5 is a configuration diagram illustrating an example of electronic equipment (display device) having the optical sensor element according to the embodiment.

FIG. 5 is a configuration diagram illustrating an example of electronic equipment 5a having the optical sensor element 1a configured as described above. The electronic equipment 5a illustrated in FIG. 5 is a display device that the device includes the optical sensor element 1a configured as described above. The electronic equipment (display device) 5a includes a display panel 51, backlight 52, display drive circuit 53, light reception drive circuit 54, image processing section 55 and application program execution section 56.

The display panel 51 includes a liquid crystal panel (LCD (Liquid Crystal Display)). The liquid crystal panel has a plurality of pixels arranged in a matrix form over the entire surface of a display area 51a in the center. The liquid crystal panel is capable of displaying an image such as predetermined graphics and text based on display data by performing a linear sequential driving (display capability). As described later, on the other hand, the display area 51a has optical sensor elements to deliver a sensor capability (imaging capability) adapted to detect an object in contact with or in proximity to the display surface of the display panel 51.

On the other hand, the backlight 52 is a light source of the display panel 51 and includes, for example, a plurality of light-emitting diodes arranged across its surface. The backlight 52 is designed to turn the light-emitting diodes on and off quickly at predetermined timings in synchronism with the operation timings of the display panel 51 as described later.

Particularly in the present embodiment, it is essential that the backlight 52 emits not only visible light for display purposes but also light at a wavelength absorbed by the semiconductor layer of the optical sensor element. For example, the semiconductor layer made of InGaZnO hardly absorbs visible light wavelengths but absorbs ultraviolet light at a wavelength of 420 nm or less. Therefore, a light source adapted to generate ultraviolet light at a wavelength of 420 nm or less is used as the backlight 52. It should be noted that an ultraviolet light source may be provided separately from the visible light source. Alternatively, light existing in normal environment (e.g., outdoor sunlight, indoor fluorescent lamp) may be used to detect the shaded area so as to recognize the object in proximity to the surface. In this case, there is no need to have any ultraviolet light source.

Next, the display drive circuit 53 drives the display panel 51 (performs a linear sequential driving of the display panel 51) to display an image on the display panel 51 based on the display data (perform a display operation).

The light reception drive circuit 54 drives the display panel 51 (performs a linear sequential driving of the display panel 51) to obtain light reception data of the display panel 51 (to image the object). It should be noted that the light reception data of each pixel is stored in a frame memory 54a on a frame-by-frame basis and output to the image processing section 55 as a captured image.

The image processing section 55 performs predetermined image processing (arithmetic operation) based on the captured image from the light reception drive circuit 54 to detect and obtain information about the object in contact with or in proximity to the display panel 51 (e.g., position coordinate data, object shape, size and other data).

The application program execution section 56 performs processing according to predetermined application software based on the detection result of the image processing section 55. For example, among such processing is displaying the display data on the display panel 51 together with the position coordinates of the detected object. It should be noted that the display data generated by the application program execution section 56 is supplied to the display drive circuit 53.

Figure 6:
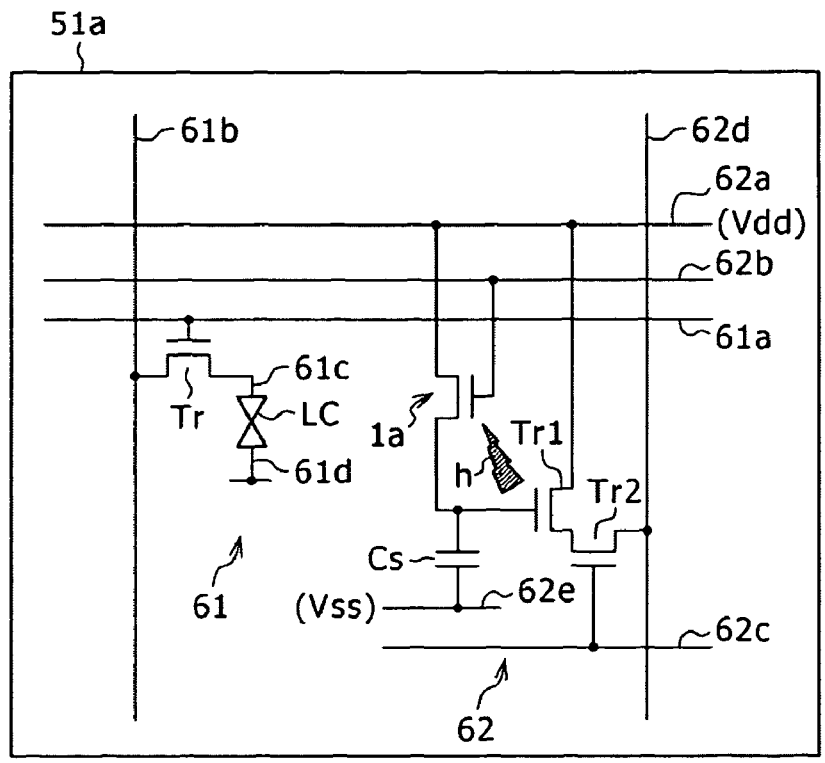
FIG. 6 is a diagram illustrating the circuit configuration of the electronic equipment according to the embodiment.

FIG. 6 is a diagram illustrating the circuit configuration of the display area 51a of the display panel 51. As illustrated in FIG. 6, a plurality of pixel sections 61 and a plurality of sensor sections 62 are formed and arranged in the display area 51a.

The pixel sections 61 are each provided at the intersection between one of a plurality of scan lines 61a disposed in the horizontal direction and one of a plurality of signal lines 61b disposed in the vertical direction. Each of the pixel sections 61 includes, for example, a thin film transistor (TFT) Tr as a switching element.

The thin film transistor Tr has its gate connected to the scan line 61a, one of its source and drain connected to the signal line 61b and the other of its source and drain connected to a pixel electrode 61c. Further, each of the pixel sections 61 includes a common electrode 61d adapted to supply a common potential Vcom to all the pixel sections 61. A liquid crystal layer LC is held between the pixel electrode 61c and common electrode 61d.

The thin film transistor Tr turns on and off based on a drive signal supplied via the scan line 61a. When the same transistor Tr is on, a pixel voltage is applied to the pixel electrode 61c based on a display signal supplied from the signal line 61b, thus driving the liquid crystal layer LC by an electric field generated between the pixel electrode 61c and common electrode 61d.

On the other hand, the sensor section 62 is provided at a predetermined portion in the display area 61a. The same section 62 may be provided one for each of the pixel sections 61 or one for the plurality of pixel sections 61. The sensor section 62 includes the optical sensor element 1a having a MOS structure described with reference to FIG. 1.

Each of the optical sensor elements 1a has its source electrode connected to a power line (Vdd) 62a and its drain electrode connected to a capacitive element Cs. The gate electrode of each of the optical sensor elements 1a is connected to a select control line 62b.

The sensor section 62 also includes two transistors Tr1 and Tr2 with the source of one transistor connected to the drain of the other transistor. The transistor Tr1, one of the two transistors, has its gate connected to the source electrode of the optical sensor element 1a and to the capacitive element Cs. The transistor Tr1 has its source or drain connected to the power line (Vdd) 62a. The transistor Tr2, the other of the two transistors, has its gate connected to a readout control electrode 62c and its source or drain connected to a signal output electrode 62d. It should be noted that the other electrode of the capacitive element Cs is connected to a power line (Vss) 62e.

As described in relation to the configuration of the optical sensor element 1a, the same element 1a is reset by a reset switch whose illustration is omitted here. The drain current is read out which changes in a non-volatile manner with change in the amount of light received by the semiconductor layer of the same element 1a. The drain current read out from the optical sensor element 1a is stored in the capacitive element Cs in the form of charge and supplied to the signal output electrode 62d by the signal supplied by the readout control electrode 62c for output to an external device.

It should be noted that the thin film transistors Tr, Tr1 and Tr2 included in the pixel and sensor sections 61 and 62 may be configured identically to the optical sensor element 1a. In this case, although identically configured to the optical sensor element 1a, the thin film transistors Tr, Tr1 and Tr2 are driven differently from the same element 1a. Therefore, the thin film transistors Tr, Tr1 and Tr2 should preferably be covered with a light-shielding film to prevent their malfunction. A film is acceptable for use as the light-shielding film so long as the film can absorb or reflect the ultraviolet light absorbed by the semiconductor layer of the optical sensor element 1a.

It should be noted that the display panel 51 configured as described above is held between two polarizing plates.

In order to drive the electronic equipment (display device) 5a described with reference to FIGS. 5 and 6, of all the light irradiated from the backlight 52, the light which has passed through the polarizing plate and reached the liquid crystal layer LC is polarized into a predetermined state by the switching of the liquid crystal layer LC as a result of the driving of the pixel electrode 61c. Then, only the light which has been polarized into the same direction as the other polarizing plate is allowed to pass through this plate for display as the display light.

On the other hand, if a finger, stylus pen or other object approaches the display surface, the shadow of external light cast by this object is detected by the optical sensor element 1a. Alternatively, the light from the backlight is reflected by the object and detected by the optical sensor element 1a. Then, the light detected by the optical sensor element 1a is read out as the drain current to detect the position of the finger or stylus pen approaching the display screen for imaging.

The electronic equipment (display device) 5a described above can detect light with high sensitivity using the optical sensor element 1a whose Vg-Id characteristic changes in a non-volatile manner as a result of the light reception of the semiconductor layer.

<Electronic Equipment 2>

Figure 7:
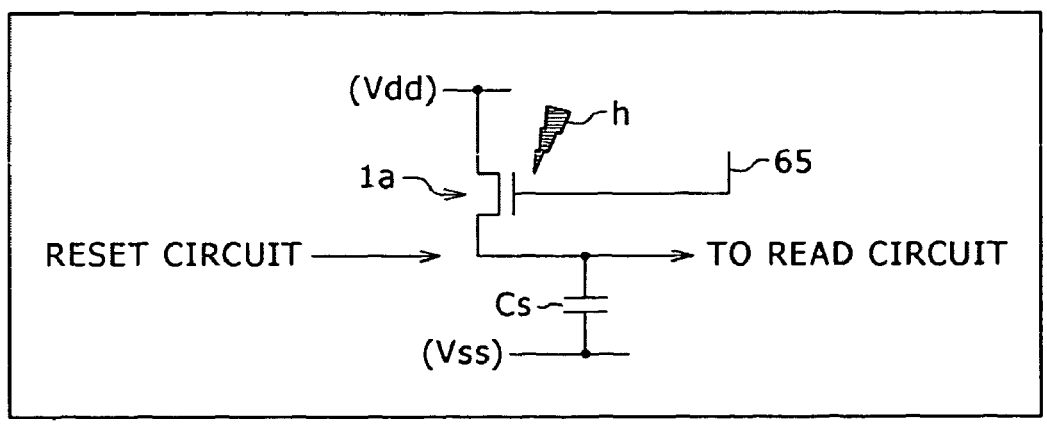
FIG. 7 is a diagram illustrating another example of circuit configuration of a sensor section of the electronic equipment according to the embodiment.

As another example, electronic equipment (display device) using the optical sensor element 1a configured as described above is applicable when the capability is provided to adjust the backlight 52 based on the intensity of external light received by providing the sensor section having the optical sensor element 1a around the display area 51a. In this case, the sensor section having the same element 1a can be configured, for example, as shown in FIG. 7.

That is, the optical sensor element 1a having a MOS structure has its source electrode connected to the power line (Vdd) and its drain electrode connected to the capacitive element Cs, a reset circuit and readout circuit. The gate electrode of the optical sensor element 1a is connected to a select control line 65. It should be noted that the other electrode of the capacitive element Cs is connected to the power line (Vss).

As described in relation to the configuration of the optical sensor element 1a, the same element 1a is reset by the reset switch whose illustration is omitted here. The drain current is read out which changes in a non-volatile manner with change in the amount of light received by the semiconductor layer of the same element 1a. The drain current read out from the optical sensor element 1a is stored in the capacitive element Cs in the form of charge and output to an external device by the signal from the readout circuit.

Further, such electronic equipment (display device) includes a light intensity control circuit rather than the light reception drive circuit 54, image processing section 55 and application program execution section 56 included in the electronic equipment (display device) 5a illustrated in FIG. 5. This control circuit controls the light intensity of the backlight 52 based on the electric signal from the optical sensor element 1a.

The electronic equipment (display device) configured as described above also permits detection of light with high sensitivity using the optical sensor element 1a whose Vg-Id characteristic changes in a non-volatile manner as a result of the light reception of the semiconductor layer.

It should be noted that a liquid crystal display device has been given as an example of electronic equipment (display device) having an optical sensor capability (imaging capability). However, such electronic equipment is not limited to a liquid crystal display device, but is widely applicable to electronic equipment having the optical sensor element 1a configured according to the present embodiment. For example, if the electronic equipment is a display device, the optical sensor element according to the present embodiment can be included in a self-luminous display device with no backlight in which organic LEDs (OLEDs) are formed on the circuit surface.

APPLICATION EXAMPLES

Electronic equipment having the optical sensor element or memory element according to the present embodiment described above is applicable to a wide range of electronic equipment including a digital camera, laptop personal computer, personal digital assistant such as mobile phone and video camcorder illustrated in FIGS. 8 to 12. These pieces of equipment are designed to display an image or video of a video signal fed to or generated inside the electronic equipment. In these pieces of electronic equipment, the optical sensor element described in relation to the embodiment can be provided in the display section to deliver an imaging capability. Further, a memory device having the memory element described in relation to the embodiment is applicable as a memory capability of the above pieces of electronic equipment. Examples of electronic equipment, to which the present embodiment is applied, will be given below.

Figure 8:
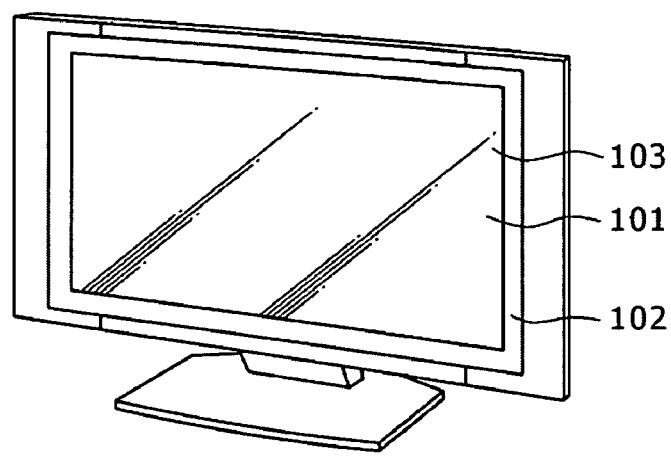
FIG. 8 is a perspective view of a television set to which the present embodiment is applied.

FIG. 8 is a perspective view illustrating a television set to which the present embodiment is applied. The television set according to the present application example includes a video display screen section 101 made up, for example, of a front panel 102, filter glass 103 and other parts. The television set is manufactured by using a display device having the optical sensor element according to the present embodiment as the video display screen section 101. Further, this television set is manufactured by using a memory device having the memory element according to the present embodiment as the memory capability.

Figure 9A:
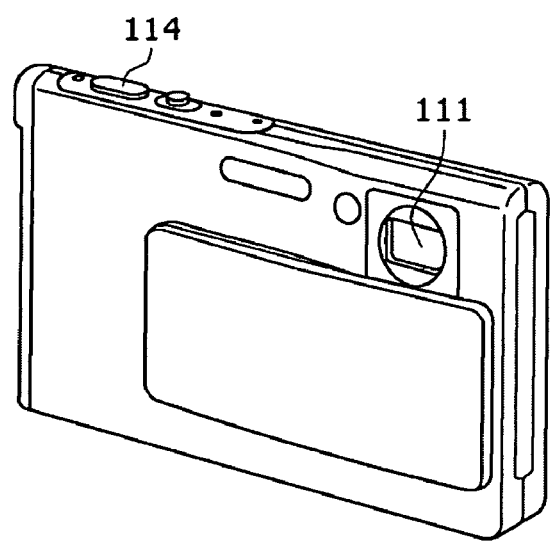
FIGS. 9A and 9B are views illustrating a digital camera to which the present embodiment is applied.
Figure 9B:
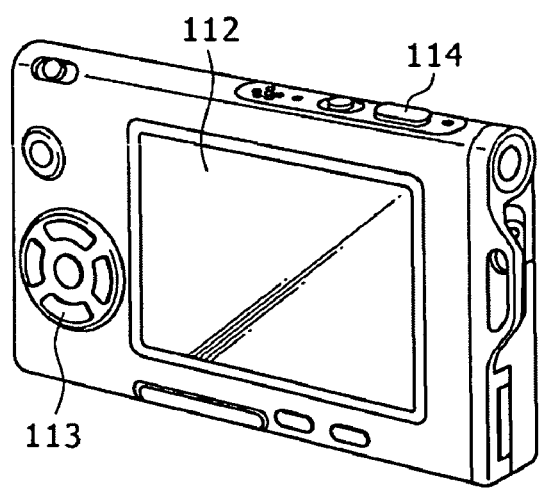

FIGS. 9A and 9B are views illustrating a digital camera to which the present embodiment is applied. FIG. 9A is a perspective view of the digital camera as seen from the front, and FIG. 9B is a perspective view thereof as seen from the rear. The digital camera according to the present application example includes a flash-emitting section 111, display section 112, menu switch 113, shutter button 114 and other parts. The digital camera is manufactured by using a display device having the optical sensor element according to the present embodiment as the display section 112. Further, this digital camera is manufactured by using a memory device having the memory element according to the present embodiment as the memory capability.

Figure 10:
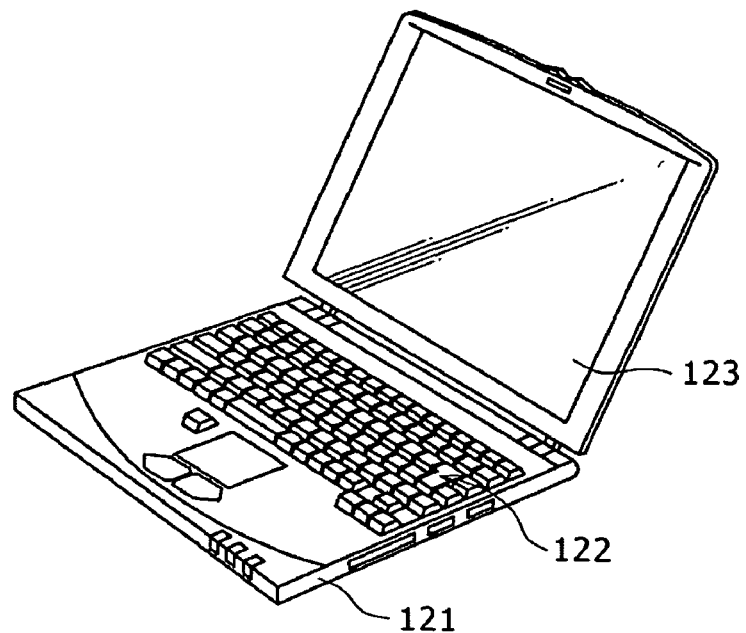
FIG. 10 is a perspective view of a laptop personal computer to which the present embodiment is applied.

FIG. 10 is a perspective view illustrating a laptop personal computer to which the present embodiment is applied. The laptop personal computer according to the present application example includes, in a main body 121, a keyboard 122 adapted to be manipulated for entry of text or other information, a display section 123 adapted to display an image, and other parts. The laptop personal computer is manufactured by using a display device having the optical sensor element according to the present embodiment as the display section 123. Further, this laptop personal computer is manufactured by using a memory device having the memory element according to the present embodiment as the memory capability.

Figure 11:
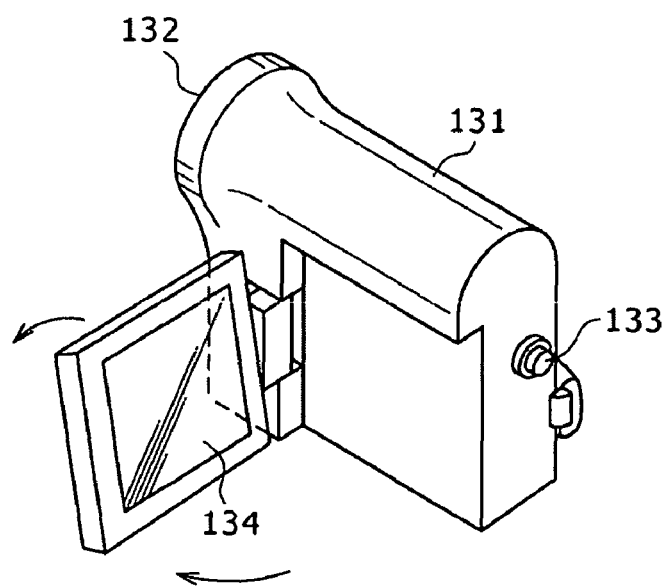
FIG. 11 is a perspective view of a video camcorder to which the present embodiment is applied.

FIG. 11 is a perspective view illustrating a video camcorder to which the present embodiment is applied. The video camcorder according to the present application example includes a main body section 131, lens 132 provided on the front-facing side surface to capture the image of the subject, imaging start/stop switch 133, display section 134 and other parts. The video camcorder is manufactured by using a display device having the optical sensor element according to the present embodiment as the display section 134. Further, this video camcorder is manufactured by using a memory device having the memory element according to the present embodiment as the memory capability.

FIGS. 12A to 12G are perspective views illustrating a personal digital assistant such as mobile phone to which the present embodiment is applied. FIG. 12A is a front view of the mobile phone in an open position. FIG. 12B is a side view thereof. FIG. 12C is a front view of the mobile phone in a closed position. FIG. 12D is a left side view. FIG. 12E is a right side view. FIG. 12F is a top view. FIG. 12G is a bottom view. The mobile phone according to the present application example includes an upper enclosure 141, lower enclosure 142, connecting section (hinge section in this example) 143, display 144, subdisplay 145, picture light 146, camera 147 and other parts. The mobile phone is manufactured by using a display device having the optical sensor element according to the present embodiment as the display 144 and subdisplay 145. Further, this mobile phone is manufactured by using a memory device having the memory element according to the present embodiment as the memory capability.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An optical sensor element having a gate electrode opposed to a semiconductor layer made of an oxide semiconductor via a gate insulating film, source and drain electrodes being connected to the semiconductor layer, wherein
the amount of light received by the semiconductor layer is read out as a drain current which changes in a non-volatile manner relative to a gate voltage, wherein
a reset operation is performed before the light reception of the semiconductor layer to restore the drain current relative to the gate voltage to the initial state before the light reception of the semiconductor layer.

2. The optical sensor element of claim 1, wherein
the drain current is read out when the gate voltage is equal to or lower than the threshold voltage in an initial state before the light reception of the semiconductor layer and equal to or higher than the voltage during the light reception of the semiconductor layer.

3. The optical sensor element of claim 1, wherein
as the reset operation, a positive voltage is applied to the gate electrode with the source and drain electrodes shorted together, or the semiconductor layer is heated.

4. The optical sensor element of claim 3, wherein
the heating is conducted by passing a current between the source and drain electrodes.

5. An imaging device having an optical sensor element, the optical sensor element having a gate electrode opposed to a semiconductor layer made of an oxide semiconductor via a gate insulating film, source and drain electrodes being connected to the semiconductor layer, wherein
the amount of light received by the semiconductor layer is read out as a drain current which changes in a non-volatile manner relative to a gate voltage, wherein
a reset operation is performed before the light reception of the semiconductor layer to restore the drain current relative to the gate voltage to the initial state before the light reception of the semiconductor layer.

6. The imaging device of claim 5, wherein
the drain current is read out when the gate voltage is equal to or lower than the threshold voltage in an initial state before the light reception of the semiconductor layer and equal to or higher than the voltage during the light reception of the semiconductor layer.

7. The imaging device of claim 5, wherein
as the reset operation, a positive voltage is applied to the gate electrode with the source and drain electrodes shorted together, or the semiconductor layer is heated.

8. The imaging device of claim 7, wherein
the heating is conducted by passing a current between the source and drain electrodes.

9. Electronic equipment having an optical sensor element, the optical sensor element having a gate electrode opposed to a semiconductor layer made of an oxide semiconductor via a gate insulating film, source and drain electrodes being connected to the semiconductor layer, wherein
the amount of light received by the semiconductor layer is read out as a drain current which changes in a non-volatile manner relative to a gate voltage, wherein
a reset operation is performed before the light reception of the semiconductor layer to restore the drain current relative to the gate voltage to the initial state before the light reception of the semiconductor layer.

10. The electronic equipment of claim 9, wherein
the drain current is read out when the gate voltage is equal to or lower than the threshold voltage in an initial state before the light reception of the semiconductor layer and equal to or higher than the voltage during the light reception of the semiconductor layer.

11. The electronic equipment of claim 9, wherein
as the reset operation, a positive voltage is applied to the gate electrode with the source and drain electrodes shorted together, or the semiconductor layer is heated.

12. The electronic equipment of claim 11, wherein
the heating is conducted by passing a current between the source and drain electrodes.

* * * * *